United States Patent
Son

(10) Patent No.: US 7,307,890 B2
(45) Date of Patent: Dec. 11, 2007

(54) METHOD FOR OPERATING PAGE BUFFER OF NONVOLATILE MEMORY DEVICE

(75) Inventor: Ji Hye Son, Kyoungki-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 70 days.

(21) Appl. No.: 11/295,205

(22) Filed: Dec. 5, 2005

(65) Prior Publication Data

US 2006/0187710 A1    Aug. 24, 2006

(30) Foreign Application Priority Data

Feb. 23, 2005  (KR) .................. 10-2005-0014935

(51) Int. Cl.
*G11C 11/34* (2006.01)
(52) U.S. Cl. ............................ 365/185.28; 365/185.12
(58) Field of Classification Search ........... 365/185.28, 365/185.12, 185.11
See application file for complete search history.

(56) References Cited

U.S. PATENT DOCUMENTS

| | | | | |
|---|---|---|---|---|
| 6,671,204 | B2 * | 12/2003 | Im .......................... | 365/185.12 |
| 6,717,857 | B2 * | 4/2004 | Byeon et al. .......... | 365/185.21 |
| 6,813,184 | B2 * | 11/2004 | Lee ........................ | 365/185.09 |
| 7,193,911 | B2 * | 3/2007 | Kim .......................... | 365/194 |

FOREIGN PATENT DOCUMENTS

| | | |
|---|---|---|
| JP | 2003-059277 A | 2/2003 |
| KR | 100255957 B1 | 2/2000 |
| KR | 2003-0033679 | 5/2003 |
| KR | 10-2003-0088595 A | 11/2003 |

* cited by examiner

*Primary Examiner*—Anh Phung
(74) *Attorney, Agent, or Firm*—Townsend & Townsend & Crew LLP

(57) ABSTRACT

A method for operating a page buffer of a nonvolatile memory device includes activating a first latch circuit of the page buffer in a programming operation and inactivating the first latch circuit in a copy-back programming operation. A second latch circuit is activated in both the copy-back programming operation and the programming operation.

14 Claims, 5 Drawing Sheets

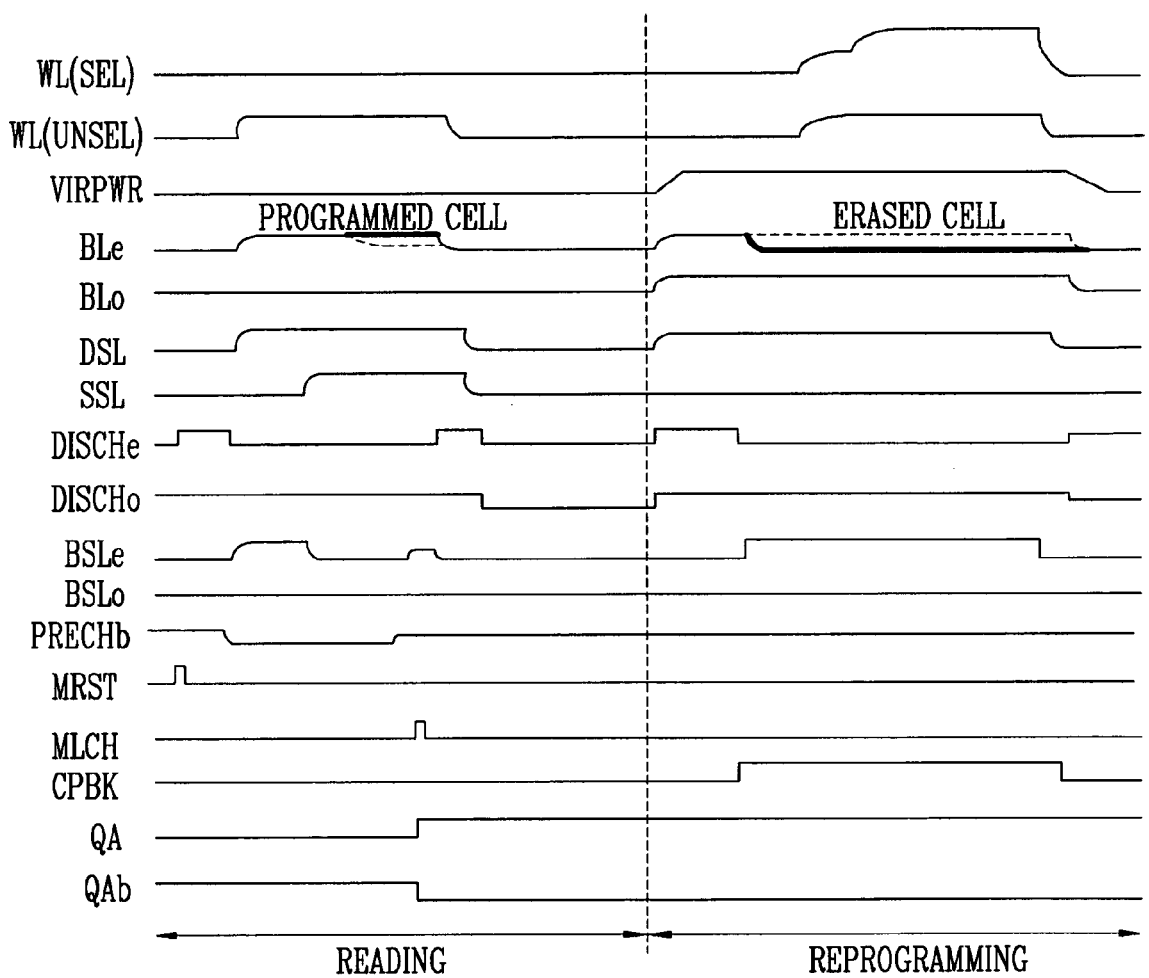

METHOD FOR OPERATING PAGE BUFFER OF NONVOLATILE MEMORY DEVICE

BACKGROUND

1. Field of the Invention

The present invention relates to methods for operating page buffers in nonvolatile memory devices and more particularly, to methods for operating a page buffer of a NAND flash memory device.

2. Discussion of Related Art

Semiconductor memory devices are known to use electrically programmable and erasable components with refresh functions for restoring data in predetermined periods. Herein, "programming" means an operation to write data in memory cells.

NAND flash memory devices have strings containing a number of memory cells serially connected to enable a high integration of a memory device (i.e., adjacent memory cells share a drain or source). NAND flash memory devices are types of memory devices that are configured to read out information in a sequence, which is different from NOR flash memory devices.

A NAND flash memory device employs page buffers to store a large amount of data into memory cells or to read out information from the memory cells. The page buffers receive a large amount of data through input/output pads and then provide the data to the memory cells, or output the data after storing the data of the memory cells. The page buffer can consist of a single register to temporarily store data, or a dual register to raise a programming speed in programming a large amount of data.

A copy-back function is required when memory cells are defective. Data in defective memory cells is transferred to other normal memory cells by way of the page buffers.

FIG. 1 is a block diagram showing a copy-back programming operation in a conventional NAND flash memory device.

Referring to FIG. 1, a conventional copy-back programming operation includes the steps of: reading out a data bit of a defective memory cell of a memory cell array 10 through a bitline (e.g., BLe) selected by a bitline selection/bias circuit 21 and a sensing node SO and then storing the read data bit into a main latch circuit 23 of a page buffer 20 (step 41); transferring the data bit from the main latch circuit 23 to a cache latch circuit 24 (step 42); returning the data bit from the cache latch circuit 24 to the main latch circuit 23 (step 43); and then reprogramming the data bit of the main latch circuit 23 in another memory cell (a normal memory cell) by way of the selected bitline and the sensing line SO (step 44).

However, such a copy-back programming scheme can result in a high probability of errors while transferring data between the main latch circuit 23 and the cache latch circuit 24.

SUMMARY OF THE INVENTION

The present invention provides a method for operation of a page buffer in a nonvolatile memory device, capable of shortening a copy-back programming time with transmission errors between latch circuits.

In one embodiment of the present invention, a nonvolatile memory device comprises: a memory cell array including a number of memory cells that are arranged on intersections of wordlines and bitlines. A number of page buffers are connected to the memory cell array through a sensing line. Each page buffer comprises: a first and second latch circuit configured to store a program data bit; a data transmission module configured to transfer the program data bit to a selected bitline through the sensing line during a programming operation, the program data bit transferred from the first latch circuit and stored in the second latch circuit; and a copy-back programming circuit connected between the second latch circuit and the sensing line and configured to conduct a copy-back programming operation. In one embodiment, the first latch circuit is activated only in the programming operation and inactivated in the copy-back programming operation, and the second latch circuit is activated in both the copy-back programming operation and the programming operation.

In another embodiment, during the copy-back programming operation, the second latch circuit reads and stores a data bit through a selected bitline and the sensing line. The data bit has been programmed in a defective memory cell among the memory cells. The copy-back programming circuit inverses the read data bit stored in a first node of the second latch circuit and transfers the inverse data bit to the selected bitline through the sensing line so as to reprogram the data bit into a normal memory cell among the memory cells.

In one embodiment, the copy-back programming circuit comprises: an inverter configured to invert a data bit of the first node of the second latch circuit during a copy-back programming operation; and a transfer module configured to transfer the inverse data bit from the inverter to the selected bitline through the sensing line.

In another embodiment, the first latch circuit comprises: a latch configured to store the program data bit, which is supplied from an external source in the programming operation; a first transfer module configured to transfer the program data bit to the first latch circuit, the first transfer module connected to first and second nodes of the first latch circuit; and a second transfer module configured to transfer a data bit from the first node of the first latch circuit to the second latch circuit through the sensing line.

In still another embodiment, the second latch circuit comprises: a latch configured to store a data bit in response to a voltage level of the sensing line during the copy-back programming operation and the programming operation; and a discharge module configured to discharge a first node of the latch in response to the voltage level of the sensing line in the copy-back programming operation, the programming operation, or a reading operation.

In one embodiment, the data transmission module comprises: a programming switch module configured to transfer a data bit from a second node of the second latch circuit to the selected bitline through the sensing line so as to program the memory cell, the programming switch module active in the programming operation; and reading a transfer module configured to transfer a data bit from the second node of the second latch circuit to an external device through a data line, the transfer module active in a reading operation.

In another embodiment, the nonvolatile memory device further comprises a verifying switch module configured to detect a programmed state of pass or failure from reading a data bit of a second node of the second latch circuit.

In still another embodiment, the page buffer comprises: a precharging circuit configured to preliminarily charge the sensing line while reading data programmed in the memory cells; and a bitline selection/bias circuit configured to select one of the bitlines and connect the selected bitline to the sensing line.

In another embodiment of the present invention, a method is provided for operating a page buffer of a nonvolatile memory device. The nonvolatile memory device includes a memory cell array composed of memory cells arranged on intersections of wordlines and bitlines, and a number of page buffers connected to the memory cell array through a sensing line. Each page buffer has a first and second latch circuit. The method comprises: activating the first and second latch circuits during a programming operation; and inactivating the first latch circuit during a copy-back programming operation.

In one embodiment, the copy-back programming operation is carried out with the steps of: reading a data bit which has been programmed in a defective memory cell through a selected bitline and sensing line; storing the read data bit into a second latch circuit; inversing the read data bit stored in the second latch circuit; transferring the inverse data bit to the selected bitline; and reprogramming the data bit into a normal memory cell among the memory cells.

In another embodiment, the copy-back programming operation comprises: precharging the sensing line; detecting a precharged or discharged state on the sensing line; and storing the data bit of the defective memory cell into the second latch circuit.

In still another embodiment, the step of inversing comprises: inversing a data bit of a first node of the second latch circuit. The programming operation may be carried out with steps comprising: storing a program data bit in the first latch circuit; transferring the program data bit from the first latch circuit to the second latch circuit through the sensing line; and transferring the program data bit to a selected bitline through the sensing line and programming the transferred data bit into the memory cell.

BRIEF DESCRIPTION OF THE DRAWINGS

The accompanying drawings are included to provide a further understanding of the invention, and are incorporated herein and constitute a part of this specification. The drawings illustrate example embodiments of the present invention and, together with the description, serve to explain principles of the present invention. In the drawings:

FIG. 5 is a timing diagram showing a copy-back programming operation in the NAND flash memory device shown FIG. 3.

DETAILED DESCRIPTION OF EMBODIMENTS

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
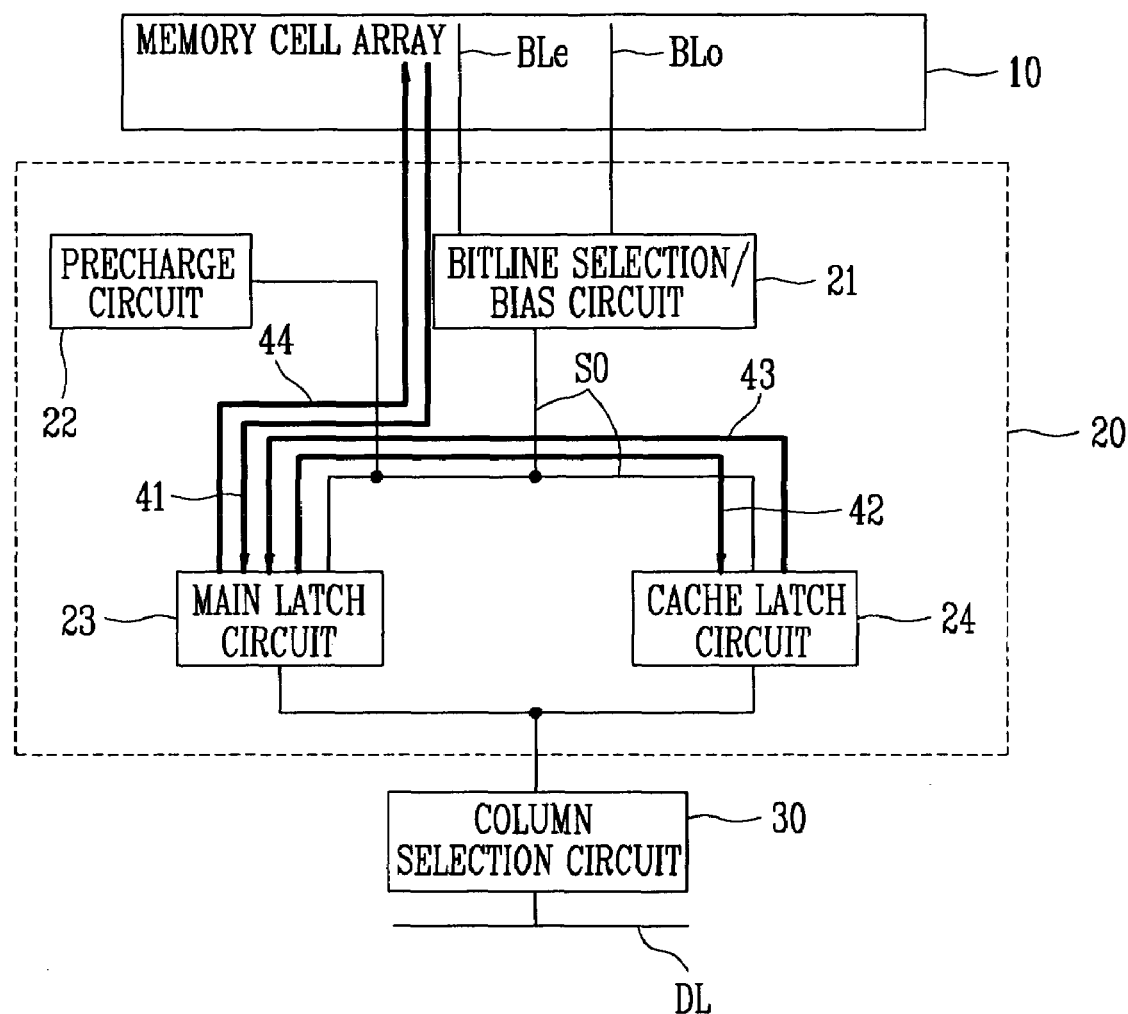
FIG. 1 is a block diagram showing a copy-back programming operation in a conventional NAND flash memory device.
Figure 2:
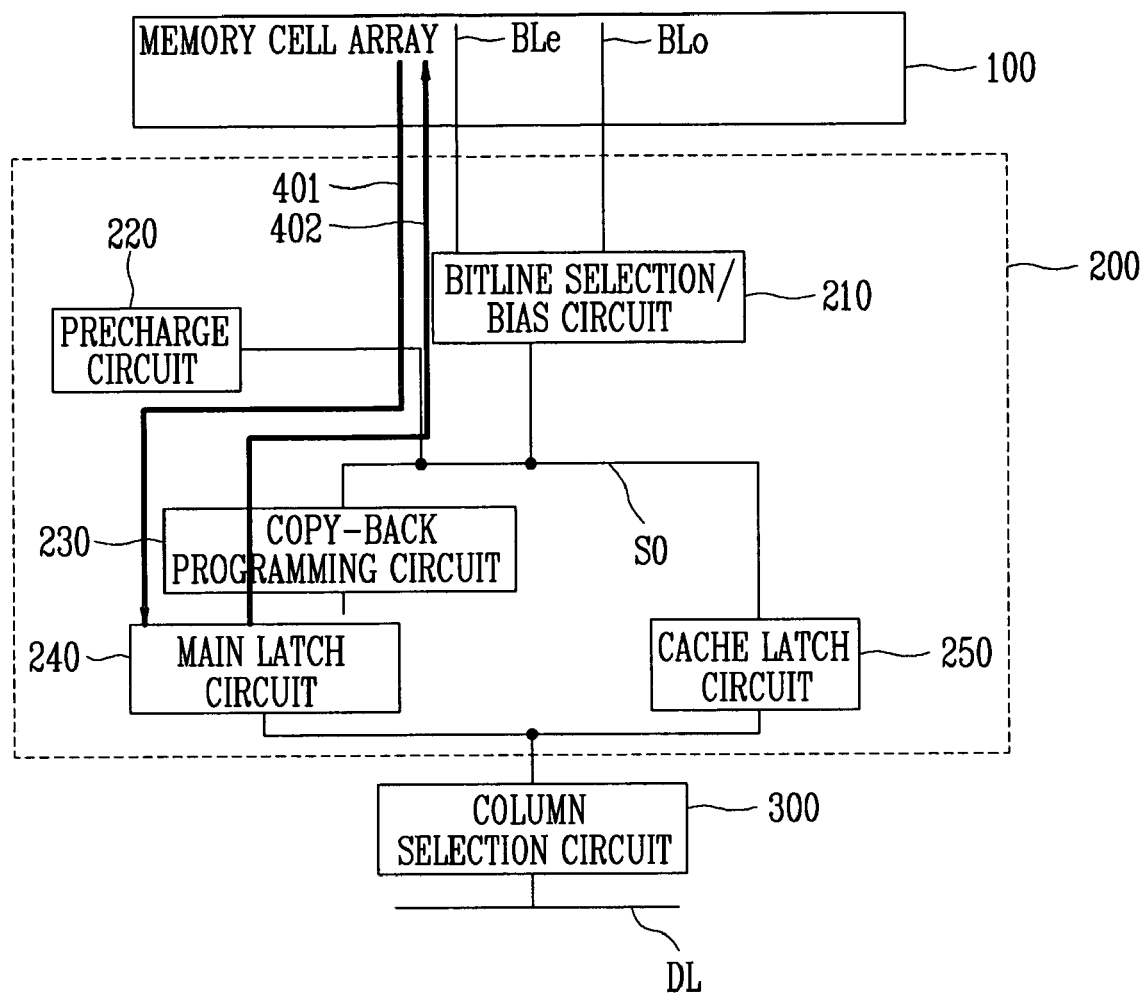
FIG. 2 is a block diagram showing a copy-back programming operation in a NAND flash memory device in accordance with one embodiment of the present invention.

FIG. 2 is a block diagram showing a copy-back programming operation in a NAND flash memory device in accordance with one embodiment of the present invention.

Referring to FIG. 2, the NAND flash memory device is programmed by first reading out a data bit into a main latch circuit 240 through a bitline (e.g., BLE) selected by a bitline selection/bias circuit 210 (step 401). The data bit comes from a defective memory cell of a memory cell array 100. The data bit is then transfered from main latch circuit 240 to a selected bitline through the copy-back programming circuit 230. The data bit in main latch circuit 240 is then reprogrammed in a normal memory cell of the memory cell array 100 (step 402).

The data bit fetched to the main latch circuit 240 is transferred to a cache latch circuit 250 and the data bit returns to the main latch circuit to be reprogrammed in the normal memory cell. The procedure shown in FIG. 2 reprograms the data bit, which is fetched to the main latch circuit 240, directly in a normal memory cell without returning it to a cache latch circuit 250.

Figure 3:
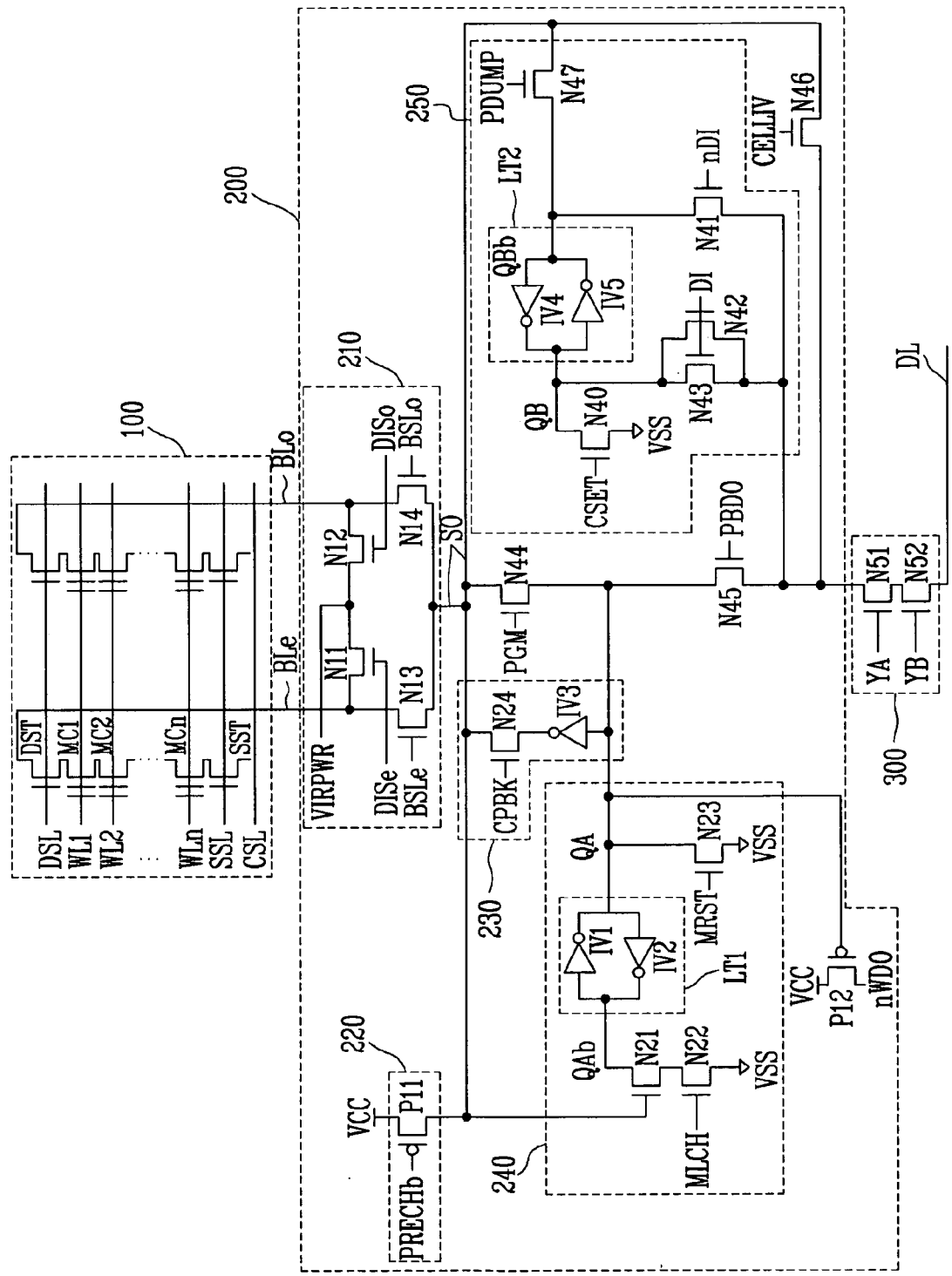
FIG. 3 is a circuit diagram illustrating the NAND flash memory device shown in FIG. 2.

FIG. 3 is a circuit diagram illustrating the NAND flash memory device shown in FIG. 2.

Referring to FIG. 3, the NAND flash memory device includes a memory cell array 100, a page buffer 200, and a column selection circuit 300.

In memory cell array 100, the reference numeral BLe denotes even-ordered bitlines while the reference numeral BLo denotes odd-ordered bitlines. A number of memory cells MC1~MCn are connected to the even-ordered bitlines BLe, while other memory cells are connected to the odd-ordered bitlines BLo. A memory cell (e.g., MC1) is controlled by a single wordline (e.g., WL1), belonging to a single page.

The page buffer 200 is coupled between the memory cell array 100 and the column selection circuit 300. Bitlines BLe and BLo are coupled to the page buffer 200 through a sensing line SO. FIG. 3 illustrates a simplified page buffer in convenience of description. It should be appreciated that any number of page buffers may be used in page buffer 200. Page buffer 200 includes a bitline selection/bias circuit 210, a precharging circuit 220, a copy-back programming circuit 230, a main latch circuit 240, and a cache latch circuit 250.

The bitline selection/bias circuit 210 includes NMOS transistors N11~N14. NMOS transistor N11 is connected between the bitline BLe and a line supplying a voltage supply signal VIRPWR. NMOS transistor N11 is turned on or off in response to a gate control signal DISe that is applied to a gate of transistor N11. NMOS transistor N11 can be turned on in response to the gate control signal DISe, applying a voltage supply signal VIRPWR as a power source voltage to bitline BLe when a data bit is to be programmed in bitline BLo. NMOS transistor N12 is connected between the bitline BLo and the line supplying the voltage supply signal VIRPWR. NMOS transistor N12 is turned on or off in response to a gate control signal DISo that is applied to a gate of transistor N12. NMOS transistor N12 can be turned on in response to the gate control signal DISo, applying a voltage supply signal VIRPWR as a power source voltage to bitline BLo when a data bit is to be programmed in bitline BLe. In one embodiment, voltage supply signal VIRPWR is set to the same level as power source voltage VCC during the programming operation. NMOS transistor N13 connects bitline BLe to the sensing line SO in response to a bitline selection signal BSLe. NMOS transistor N14 connects bitline BLo to sensing line SO in response to a bitline selection signal BSLo.

Precharging circuit 220 is connected between a power source voltage VCC and a sensing line SO. The precharging circuit 220 includes a PMOS transistor P11 that may be turned on or off in response to a precharge signal PRECHb applied to a gate of transistor P11. PMOS transistor P11 precharges sensing line SO up to the power source voltage VCC during the reading operation, supplying a current to bitline BLe or BLo through sensing line SO.

Main latch circuit 240 includes NMOS transistors N21~N23 and a first latch LT1. The first latch LT1 includes inverters IV1 and IV2, configured to temporarily store a data bit read out from a memory cell. The NMOS transistor N21 is turned on or off in response to a signal on the sensing line SO. NMOS transistor N22 is turned on or off in response to a main latch signal MLCH. In one embodiment, NMOS transistor N22 is turned on when NMOS transistor N21 is turned on, changing a node QAb of the first latch LT1 to a logic low (e.g., '0') while a node QA of the first latch LT1 is changed to a logic high (e.g., '1'). NMOS transistor N23 is coupled between the node QA of the first latch LT1 and a ground voltage VSS, initializing the node QA of the first latch LT1 to '0' and node QAb to '1' in response to a reset signal MRST applied to a gate of transistor N23.

Copy-back programming circuit 230 includes an inverter IV3 and an NMOS transistor N24. The inverter IV3 outputs an inverse signal from a signal of the node QAb of the first latch LT1. The NMOS transistor N24 is coupled between the sensing line SO and the main latch circuit 240. NMOS transistor N24 is turned on in response to a copy-back signal CPBK applied to a gate of transistor N24. The NMOS transistor N24 connects the main latch circuit 240 to the sensing line SO, in order to reprogram a data bit of a defective memory cell, which is stored in the main latch circuit 240, into a normal cell in the copy-back programming operation.

Cache latch circuit 250 includes NMOS transistors N40~N43 and N47, and a second latch LT2. The second latch LT2 is includes inverters IV4 and IV5 configured to temporarily store a data bit transferred from the main latch circuit 240. NMOS transistor N40 is coupled between the node QB of the second latch LT2 and a ground voltage VSS, initializing the node QB of the second latch LT2 to logic low (e.g., '0') and the node QBb to logic high (e.g., '1') in response to a reset signal CSET applied to a gate of transistor N40. NMOS transistor N41 stores a program data bit which is transferred from an external source into the second latch LT2 through a data line in response to a data input signal nDI. NMOS transistors N42 and N43 store data to be programmed, which is transferred from an external source into the second latch LT2 through a data line in response to a data input signal DI. NMOS transistor N47 is turned on in response to a program dump signal PDUMP in the program operation, transferring a data bit from node QBb of the second latch LT2 to the main latch circuit 250 through the sensing line SO.

In one embodiment, page buffer 200 includes NMOS transistors N44~N46, a PMOS transistor P12, a bitline selection/bias circuit 210, a precharging circuit 220, a copy-back programming circuit 230, a main latch circuit 240, and a cache latch circuit 250. NMOS transistor N44 is turned on in response to a program signal PGM in the programming operation, transferring a program data bit to a selected bitline (e.g., BLe) through sensing line SO. An example of a program data bit is a data bit of node QA of first latch LT1. NMOS transistor N45 is turned on in response to a read signal PBDO in the read operation, transferring a data bit from the selected bitline to the data line DL through column selection circuit 300. PMOS transistor P12 is connected between the power source voltage VCC and a node nWDO. Transistor P12 is turned on or off in response to the data bit of the node QA of the first latch LT1 so as to verify pass or fail of the memory cell by the programming or erasing operation.

Column selection circuit 300 includes two NMOS transistors N51 and N52 controlled by column selection signals YA and YB. The NMOS transistors, N51 and N52, function to connect the page buffer 200 to the data line DL in the reading and programming operations. The column selection signals, YA and YB, are generated from a column address.

Figure 4:
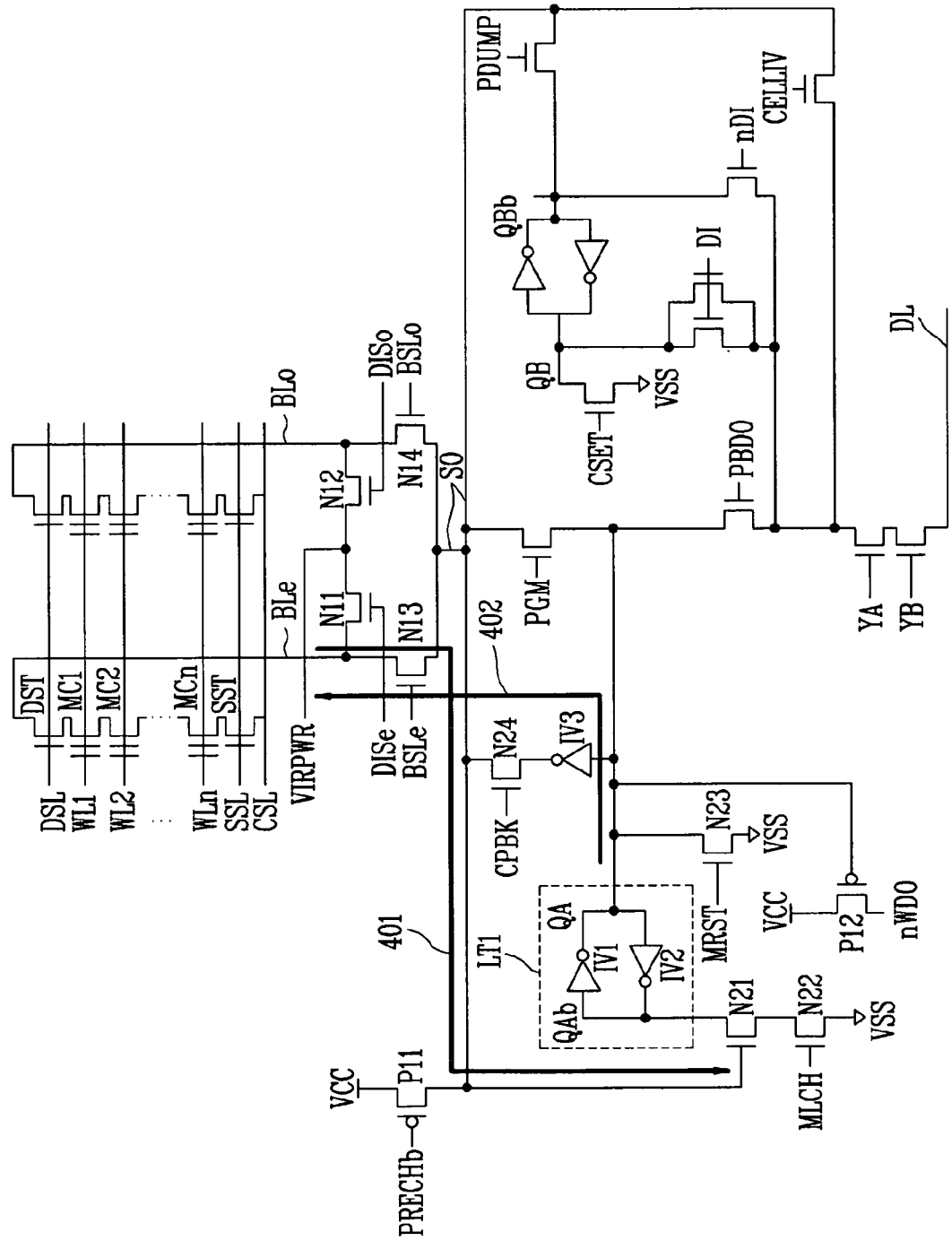
FIG. 4 is a circuit diagram showing a copy-back programming operation in the NAND flash memory device shown FIG. 3.

FIGS. 4 and 5 are circuit and timing diagrams showing the copy-back programming operation in the NAND flash memory device shown FIG. 3.

In accordance with one embodiment of the present invention, to illustrate the copy-back programming operation, assume that a defective memory cell is MC1. A data bit of the defective memory cell MC1 is read into the first latch circuit 240 and then reprogrammed into a normal memory cell (e.g., MC2).

In one embodiment, NMOS transistor N13 is turned on to select a wordline WL1 and a bitline BLe in response to the bitline selection signal BSLe. This is done to read out a data bit from the memory cell MC1 and reprogram it into another normal memory cell.

As illustrated in FIGS. 4 and 5, the reset signal MRST initializes (e.g., produces a pulse) so that node QA of the first latch LT1 is set to logic low (e.g., '0') and the node QAb of the first latch LT1 is set to logic high (e.g., '1'). Sensing line SO is precharged to equal the level of power source voltage VCC. As memory cell MC1 remains a program cell, sensing line SO retains the precharged voltage equal to power source voltage VCC. NMOS transistors N21 and N22 are turned on as illustrated in FIG. 5, so that the node QAb of the first latch LT1 is set to '0' and the node QA of the first latch LT1 is changed to '1' (reading step 401).

During this process, inverter IV3 turns the node QA of the first latch LT1 from '1' to '0'. As NMOS transistor N24 is turned on in response to the copy-back signal CPBK, the data bit '0' output from the inverter IV3 is transferred to the bitline BLe and the data bit of the memory cell MC1 is reprogrammed into the normal memory cell MC2 (programming step 402).

In accordance with one embodiment of the present invention, the copy-back programming operation may be executed with just a main latch circuit without a cache latch circuit.

In accordance with one embodiment of the present invention, it is possible to reprogram a data bit from a defective memory cell into a normal memory cell directly through a bitline without using a cache latch. This can raise a speed of the copy-back programming operation.

Although the present invention has been described in connection with the embodiment of the present invention illustrated in the accompanying drawings, it is not limited by the embodiments described. It will be apparent to those skilled in the art that various substitutions, modifications and changes may be made without departing from the scope and spirit of the present invention.

What is claimed is:

1. A nonvolatile memory device comprising:
a memory cell array including a plurality of memory cells; and
a plurality of the page buffers coupled to the memory cell array through a sensing line,
wherein each page buffer includes:
first and second latch circuits configured to store a program data bit;
a data transmission module configured to transfer the program data bit to a selected bitline through the sensing line, the program data bit transferred from the second latch circuit and stored in the first latch circuit during a programming operation; and
a copy-back programming circuit coupled between the first latch circuit and the sensing line and configured to conduct a copy-back programming operation,
wherein the second latch circuit is configured to be activated in the programming operation and not activated in the copy-back programming operation, and the first latch circuit is configured to be activated in both the copy-back programming operation and the programming operation.

2. The nonvolatile memory device as set forth in claim 1, wherein the first latch circuit reads and stores a program data bit which has been programmed in a defective memory cell, and the copy-back programming circuit inverses the read data bit stored in a first node of the first latch circuit and transfers the inverse data bit to the selected bitline through the sensing line so as to reprogram the data bit into a normal memory cell.

3. The nonvolatile memory device as set forth in claim 2, wherein the copy-back programming circuit comprises:
an inverter configured to invert a data bit of the first node of the first latch circuit in the copy-back programming operation,
wherein the inverted data bit is transferred from the inverter to the selected bitline through the sensing line.

4. The nonvolatile memory device as set forth in claim 1, wherein the copy-back programming circuit comprises:
an inverter configured to invert a data bit of the first node of the first latch circuit in the copy-back programming operation,
wherein the inverted data bit is transferred from the inverter to the selected bitline through the sensing line.

5. The nonvolatile memory device as set forth in claim 1, wherein the second latch circuit comprises:
a latch configured to store the program data bit, the latch supplied with an external voltage source in the programming operation;
a first transfer module configured to transfer the program data bit, the first transfer module coupled to first and second nodes of the second latch circuit; and
a second transfer module configured to transfer a data bit from the first node of the second latch circuit to the first latch circuit through the sensing line.

6. The nonvolatile memory device as set forth in claim 1, wherein the first latch circuit comprises:
a latch configured to store a data bit in response to a voltage level of the sensing line during the copy-back programming operation and the programming operation; and
a discharge module configured to discharge a first node of the latch in response to the voltage level of the sensing line in the copy-back programming operation, the programming operation, or a reading operation.

7. The nonvolatile memory device as set forth in claim 1, wherein the data transmission module comprises:
a programming switch module configured to transfer a data bit from a second node of the first latch circuit to the selected bitline through the sensing line so as to program the memory cell; and
a reading switch module configured to transfer a data bit from the second node of the first latch circuit to an external device through a data line.

8. The nonvolatile memory device as set forth in claim 1, which further comprises verifying switch module configured to detect a programmed state of pass or failure from reading a data bit of a second node of the first latch circuit.

9. The nonvolatile memory device as set forth in claim 1, wherein the page buffer comprises:
a precharging circuit configured to preliminarily charge the sensing line while reading data programmed in the memory cells; and
a bitline selection/bias circuit configured to select one of the bitlines and connecting the selected bitline to the sensing line.

10. A method for operating a page buffer of a nonvolatile memory device including a memory cell array composed of a plurality of memory cells, a plurality of page buffers coupled to the memory cell array through a sensing line, each page buffer having first and second latch circuits, the method comprising:
activating the first and second latch circuits during a programming operation;
inactivating the second latch circuit during a copy-back programming operation; and
activating the first latch circuit during the copy-back programming operation.

11. The method as set forth in claim 10, wherein the copy-back programming operation comprises:
reading a program data bit that has been programmed in a defective memory cell through a selected bitline and the sensing line;
storing the read program data bit into the first latch circuit;
inversing the read program data bit stored in the first latch circuit; and
transferring the inverted data bit to the selected bitline to reprogram the inverted data bit into a memory cell other than the defective memory cell.

12. The method as set forth in claim 11, wherein the reading step comprises:
precharging the sensing line; and
detecting a precharged or discharged state on the sensing line.

13. The method as set forth in claim 11, wherein the step of inversing comprises:
inversing a data bit of a first node of the first latch circuit.

14. The method as set forth in claim 10, wherein the programming operation comprises:
storing a program data bit in the second latch circuit;
transferring the program data bit from the second latch circuit to the first latch circuit through the sensing line; and
transferring the program data bit to a selected bitline through the sensing line and programming the transferred data bit into the memory cell.

* * * * *